United States Patent [19]

Khan

[11] Patent Number: 5,377,203
[45] Date of Patent: Dec. 27, 1994

[54] TEST DATA FORMATTER

[75] Inventor: Mashkoor H. Khan, Dallas, Tex.

[73] Assignee: Texas Instruments Incorporated, Dallas, Tex.

[21] Appl. No.: 197,660

[22] Filed: Feb. 17, 1994

Related U.S. Application Data

[63] Continuation of Ser. No. 108,843, Aug. 18, 1993, which is a continuation of Ser. No. 7,396, Jan. 21, 1993, abandoned, which is a continuation of Ser. No. 839,749, Feb. 20, 1992, abandoned, which is a continuation of Ser. No. 707,430, May 28, 1991, which is a continuation of Ser. No. 314,607, Feb. 23, 1989, abandoned.

[51] Int. Cl.⁵ .................. G01R 31/28; G06F 11/00
[52] U.S. Cl. ............................................. 371/27
[58] Field of Search .............. 371/27, 25.1, 23, 22.1, 371/15.1, 22.3; 364/580

[56] References Cited

U.S. PATENT DOCUMENTS

| | | | |
|---|---|---|---|
| 4,450,560 | 5/1984 | Conner | 371/22.1 X |
| 4,710,931 | 12/1987 | Bellay | 371/25.1 |
| 4,727,312 | 2/1988 | Fulks | 371/27 X |
| 4,766,595 | 8/1988 | Gollomp | 371/23 |
| 4,862,399 | 8/1989 | Freeman | 371/23 X |
| 4,903,267 | 2/1990 | Arai | 371/27 |
| 4,907,180 | 3/1990 | Smith | 371/23 X |
| 5,063,383 | 11/1991 | Bobba | 341/120 |

OTHER PUBLICATIONS

J. M. Dinwiddie, et al, "Test Pattern Methodology For VSI/VLSI Module Level Testing and In-Circuit Card Testing", IBMTDB, vol. 26, No. 11, Apr. 1984, pp. 5909–5910.

E. P. Hsieh, et al, "Test Generation System For Mixed Technologia", IBMTDB, vol. 22, No. 8A, Jan. 1980, pp. 3214–3218.

R. M. Peters, "Automatic Generation of Bit Patterns For Array Testing", IBMTDB, vol. 25, No. 713, Dec. 1982 pp. 4024–4028.

"Parallel Module Testing Application Note", Texas Instruments Inc., 1988, Jun.

Primary Examiner—Robert W. Beausoliel, Jr.
Assistant Examiner—Ly V. Hua
Attorney, Agent, or Firm—Mark E. Courtney; Wade James Brady; Richard L. Donaldson

[57] ABSTRACT

A formatting program (30) receives format data from a detector file (32) and test data from a test data file (34) in order to form a formatted test data file (36). The format test data file (36) is used by an automatic test generation program (38) to perform testing on one or more module in an integrated circuit.

9 Claims, 6 Drawing Sheets

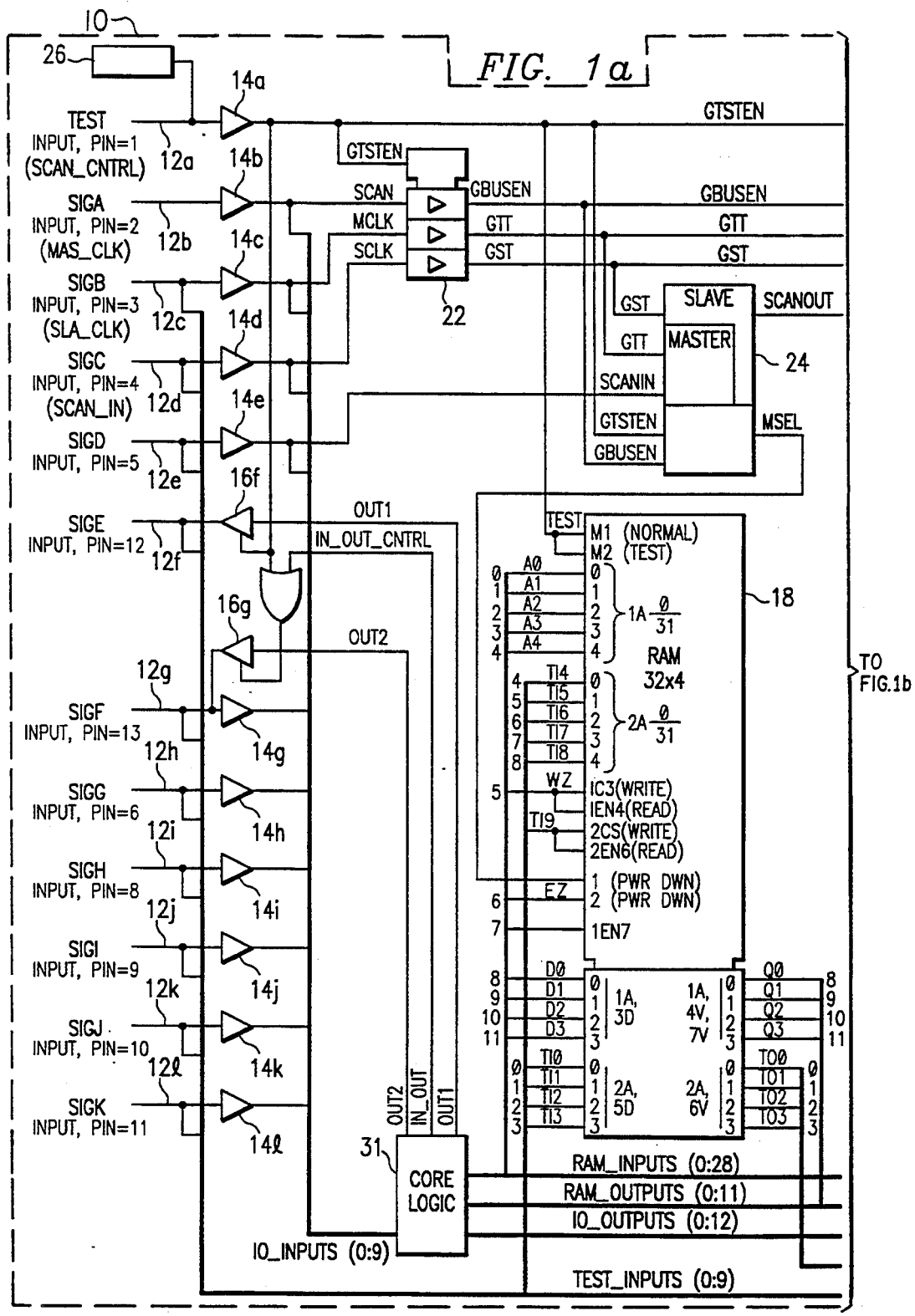

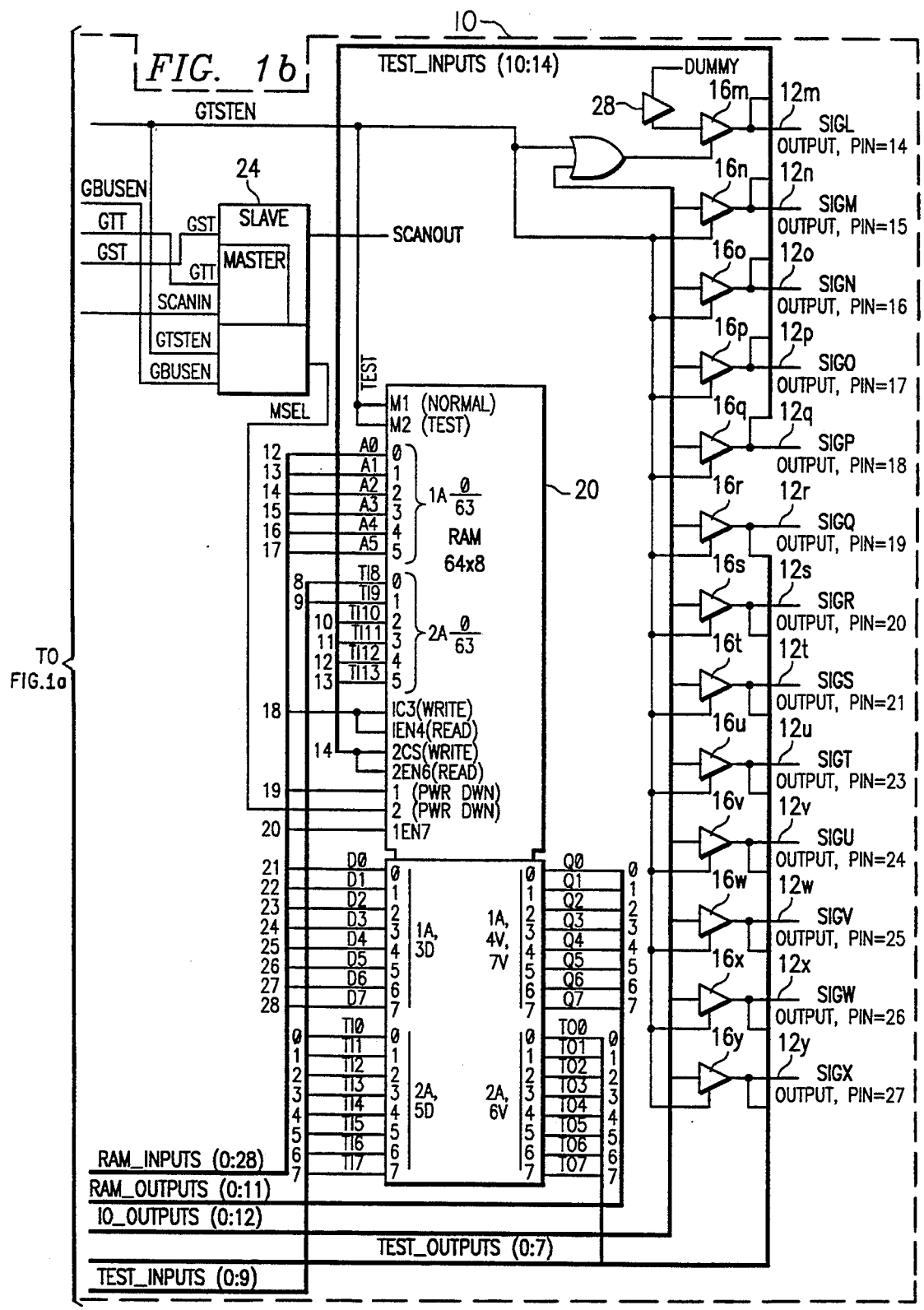

SETR P:='L_L_L_L_H';
SETR P:='H_L_L_L_H';
SETR P:='H_C_C_L_H';
SETR P:='H_C_C_L_H';
SETR P:='H_C_C_H_H';
SETR P:='H_C_C_L_H';
SETR P:='H_L_L_L_L';

H = HIGH LEVEL LOGIC
L = LOW LEVEL LOGIC
C = CLOCK SIGNAL

```
(**************************************************************)
(*                                                              *)
(* ============================================================ *)
(*              TDL SCRAMBLE OUTPUT TDL                         *)
(* ============================================================ *)
(*                                                              *)
(* SOFTWARE VERSION NUMBER  : 0.01                              *)
(*                                                              *)
(* DESIGN NAME              : SCRAMBLE                          *)
(*                                                              *)
(* DATE/TIME CREATED        : 16 FEBRUARY 1988, 15:19:24        *)
(*                                                              *)
(* PROCEDURAL CELL NAME     : CC648                             *)
(*                                                              *)
(**************************************************************)
```
(* HEADER INFO *)

```
CONNECT P, VAR = (A0_SCAN,A1_MCLK_TI0,A2_SCLK_TI1,A3_SCANIN_TI2,A4_TI3,
                  A5_TI4,CLK_T06,D0_TI5,D1_TI6,D2_L0_TI7,D3_L1_TI8,
                  D4_L2_TI9,D5_L3_TI10,D6_L4_TI11,D7_L5_TI12,LD_T07,
                  Q0_TI13,Q1_TI14,Q2_T00,Q3_T01,Q4_T02,Q5_T03,Q6_T04,
                  Q7_T05,RD_WTZ,TEST),
            PIN = (15,16,17,18,19,20,3,21,22,23,24,25,26,27,1,4,6,7,8,9,
                   10,11,12,13,5,2),
         DEFPIN = (IN 16, PUT 8 IN 2 );
      (*$ PERIOD = 10000/10; *)
          CLOCK = A1_MCLK_TI0,
        PATTERN = 010, HOLD0 = 300, HOLD1 = 300;
          CLOCK = A2_SCLK_TI1,
        PATTERN = 010, HOLD0 = 600, HOLD1 = 300;
```

(* TEST HOOK-UP TDL PATTERNS *)

SCAN ⟶                                    ⟵ TEST

```
    SETR P:=T'HLLLYYYYYYYYYYYYYMMMMMMMMYL';
    SETR P:=T'HLLLYYYYYYYYYYYYYMMMMMMMMYH';
    SETR P:=T'HCCHYYYYYYYYYYYYYMMMMMMMMYH';
    SETR P:=T'HCCLYYYYYYYYYYYYYMMMMMMMMYH';
    SETR P:=T'LLLLYYYYYYYYYYYYYMMMMMMMMYH';
```

(* TEST DATA *)

*FIG. 5*

```
    SETR P:=T'LLLLLLLMLLLLLLLLMLCMMMMMYH';
    SETR P:=T'LHLLLLLMLLLHLLLLMLCMMMMMYH';
    SETR P:=T'LLHLLLLMLLLLHLLLMLCMMMMMYH';
                        •
                        •
                        •
    SETR P:=T'LHLHLLLMLLLHLHLLMLCMMMMMYH';
    SETR P:=T'LLHHLLLMLLLLHHLLMLCMMMMMYH';
    SETR P:=T'LHHHLLLMLLLHHHLLMLCMMMMMYH';
```

```
(**********************************************************************)
(*                                                                    *)
(* ================================================================== *)
(*                    TDL SCRAMBLE OUTPUT TDL                         *)
(* ================================================================== *)
(*                                                                    *)
(* SOFTWARE VERSION NUMBER   : 0.01                                   *)
(*                                                                    *)
(* DESIGN NAME               : SCRAMBLE                               *)
(*                                                                    *)
(* DATE/TIME CREATED         : 16 FEBRUARY 1988, 15:19:24             *)
(*                                                                    *)
(* PROCEDURAL CELL NAME      : CC648                                  *)
(*                                                                    *)
(**********************************************************************)
```
(* HEADER INFO *)

```
CONNECT P, VAR = (A0_SCAN,A1_MCLK_TI0,A2_SCLK_TI1,A3_SCANIN_TI2,A4_TI3,
                  A5_TI4,CLK_T06,D0_TI5,D1_TI6,D2_L0_TI7,D3_L1_TI8,
                  D4_L2_TI9,D5_L3_TI10,D6_L4_TI11,D7_L5_TI12,LD_T07,
                  Q0_TI13,Q1_TI14,Q2_T00,Q3_T01,Q4_T02,Q5_T03,Q6_T04,
                  Q7_T05,RD_WTZ,TEST),
            PIN = (15,16,17,18,19,20,3,21,22,23,24,25,26,27,1,4,6,7,8,9,
                   10,11,12,13,5,2),
         DEFPIN = (IN 16, PUT 8 IN 2 );
    (*$ PERIOD = 10000/10; *)
          CLOCK = A1_MCLK_TI0,
        PATTERN = 010, HOLD0 = 300, HOLD1 = 300;
          CLOCK = A2_SCLK_TI1,
        PATTERN = 010, HOLD0 = 600, HOLD1 = 300;

(* TEST HOOK-UP TDL PATTERNS *)

SETR P:=T'HLLLYYYYYYYYYYYYYMMMMMMMMYL';
SETR P:=T'HLLLYYYYYYYYYYYYYMMMMMMMMYH';
SETR P:=T'HCCHYYYYYYYYYYYYYMMMMMMMMYH';
SETR P:=T'HCCLYYYYYYYYYYYYYMMMMMMMMYH';
SETR P:=T'LLLLYYYYYYYYYYYYYMMMMMMMMYH';

(*   TEST DATA   *)
SETR P:=T'LLLLLLLYLLLLLLLCYMMMMMMMMYH';
SETR P:=T'LHLLLLYLLLHLLLCYMMMMMMMMYH';
SETR P:=T'LLHLLLLYLLLLHLLCYMMMMMMMMYH';
SETR P:=T'LHHLLLYLLLLHHLLCYMMMMMMMMYH';
SETR P:=T'LLLHLLYLLLHLLLCYMMMMMMMMYH';
                    •
                    •
SETR P:=T'LHHHLLYLHHHLLLCYMMMMMMMMYH';
SETR P:=T'LLLLHLYLLLLHHLCYMMMMMMMMYH';
SETR P:=T'LHLHLYLHLLHLLCYMMMMMMMMYH';
SETR P:=T'LLHLHLYLLHLHLLCYMMMMMMMMYH';
```

FIG. 7

TEST DATA FORMATTER

This application is a continuation of application Ser. No. 08/108,843 (which is a continuation of 08/007,396 filed Jan. 21, 1993, now abandoned which is a continuation of 07/839,749 filed Feb. 20, 1992, now abandoned which is a continuation of 07/707,430 filed May 28, 1991 which is a continuation of 07/314,607 filed Feb. 23, 1989, now abandoned), filed Aug. 18, 1993.

TECHNICAL FIELD OF THE INVENTION

This invention relates in general to integrated circuits, and more particularly to a method and apparatus for formatting test program data for testing an integrated circuit.

BACKGROUND OF THE INVENTION

One of the critical features of an integrated circuit design is its testability, the degree to which the fabricated device can be tested for production defects. No matter how perfectly a design functions in simulation, it becomes an unreliable component if it cannot be tested adequately after fabrication.

Since the internal nodes of an integrated circuit are accessible only through its package pins, The testing strategy should include testing individual elements (modules) of the circuit or logic design. The more complex the design, the more difficult it is to test, and the greater the need is to incorporate schemes into the design to enhance testability.

Application specific integrated circuits (ASICs) are among the most complex of all IC designs. ASICs are formed by combining subcircuits (modules) from a cell library to implement the desired function. During design of the ASIC device, the designer can incorporate logic to allow an external testing device to select and isolate one module at a time for testing. A set of input stimuli, designed to ensure high fault coverage for the module, is then applied. The input stimuli are applied in parallel to all input pins of the module at a predetermined rate and the responses of module outputs are sampled and compared to the expected data. Inputs to modules that are not selected are held at their last forced value by means of bus holder circuitry.

One problem associated with the parallel module testability (PMT) described above is the amount of work required to generate test data specific to the integrated circuit in which the module is being used. A given integrated circuit will have a unique set of signals which must be applied to its input pins for testing a module within the integrated circuit. The number of pins and signals that should be applied thereto will vary between integrated circuits, necessitating a customized set of test data. While the test data could be generated manually, such a task would require many man-hours and would involve a high likelihood of error.

Thus, a need has arisen for a fast and reliable method and apparatus of generating test data for input to an integrated circuit to test one or more modules contained therein.

SUMMARY OF THE INVENTION

In accordance with the present invention, a method of formatting test data is provided which substantially eliminates or prevents the disadvantages and problems associated with previous systems. In the first aspect of the present invention, formatted data is provided by defining a relationship between the package pins of the integrated circuit and test nodes in the integrated circuit corresponding to a given module. The file containing test data to be applied to one or more of the test nodes is generated and input to a formatting program which arranges the generated test data in a predetermined order associated with the package pins to the integrated circuit.

This aspect of the present invention provides a significant savings in man-hours in preparing the formatted data. Further, the present invention is much less prone to human error to ensure reliable testing.

In a second aspect of the present invention, formatted data for testing one or more circuit modules is produced by defining a relationship between the package pins of the integrated circuits and the test nodes of one or more of the modules in the integrated circuit. Test data to be applied to the test module is generated along with control signals to be applied to the test modules and expected data to be compared with data output from the test modules. The test data, control signals, and expected data are arranged in a predetermined format with the package pins.

In a third aspect of the invention, an apparatus for producing formatted data for testing modules on an I.C. is disclosed. A memory for storing data defining a relationship between package pins of the integrated circuit and test nodes of one or more modules in the integrated circuit is coupled to a processor for arranging the test data in a predetermined order associated with the package pins.

BRIEF DESCRIPTION OF THE DRAWINGS

For a more complete understanding of the present invention and the advantages thereof, reference is now made to the following descriptions taken in conjunction with the accompanying drawings, in which:

FIGS. 1a–b illustrate an integrated circuit compatible with parallel module testing;

FIG. 5 illustrates a formatted data file for a first module;

FIG. 7 illustrates a formatted test data file used in conjunction with a second module in the integrated circuit.

FIG. 8 illustrates an apparatus for testing modules on an I.C. consisting of a data memory and a processor.

DETAILED DESCRIPTION OF THE INVENTION

Figure 2:
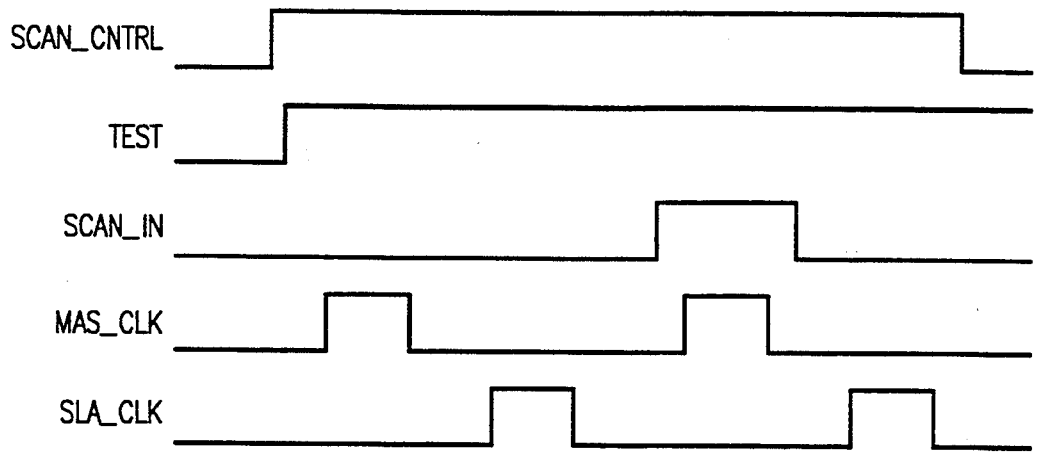
FIG. 2 illustrates the PMT test control signals used for initialization of one of the modules in the integrated circuit of FIGURE

FIGS. 1a and 1b illustrate an exemplary integrated circuit with circuitry to perform parallel module testing (PMT). Integrated circuit (IC) 10 has a plurality of package pins 12a–y. Pins 12a–e and 12h–l are operable to input a signal to the integrated circuit 10, pins 12f and 12m–y are operable to output signals from the integrated circuit 10, and pin 12g is operable for both input and output.

The input pins are connected to associated input buffers 14, and the output pins are connected to associated tristate output buffers 16. The input/output pin 12g is connected to both input and output buffers and 16g.

FIGS. 1a and 1b illustrates a typical application PMT in a design example containing a 32×4 RAM 18, a 64×8 RAM 20, and additional logic comprised of gates and flip-flops. Special cells, designed to be used in the implementation of PMT, are also included in the example—one test port clock controller cell 22 is required in any design with PMT and one test port controller cell 24 is required for each of the two RAMs 18 and 20.

One package signal pin, pin 12a in the illustrated embodiment, is required to be dedicated solely to the test mode of operation. This pin, given the name TEST, must be connected to the input terminal of a non-inverting input buffer 14. The input terminal must also be connected to a core cell 26 that functions as a pull-down resistor (i.e., provides a resistive path to ground). When entering the test mode, the signal TEST driven to a logic 1 (high). During normal operation of the design, TEST must be held at a logic 0 (low). The pull-down resistor 26 ensures a logic 0 level with no external signal source requirement.

In this design example, TEST is connected to an input buffer 14 and to a pull-down cell 26. The output of this input buffer 14 is the signal GTSTEN (Global Test Enable). This signal must connect to the TEST terminal of each module (RAMs 18 and 20) with built-in testability. When GTSTEN is driven to a logic 1, the test mode of each module is selected. In this example, GTSTEN is connected to the TEST terminal of each of the two RAMs 18 and 20.

The signal GTSTEN must also be connected to the GTSTEN terminal of one, and only one, test port clock controller cell 22. The test port clock controller cell 22 is a soft macro containing the logic necessary to enter the module section data into a shift register composed of test port controller cells 24. When TEST is at logic 0, GTSTEN forces the shift register clocks, the GTT (Global Test True) and GST (Global Slave True) outputs of the zest port clock controller cell 22, to an inactive state (logic 0). Thus, when TEST is at a logic 0, the module select shift register, comprised of two test port controller cells, cannot be clocked. When TEST is driven to a logic 1, the clocks to the test port clock controller cell 22, SCLK and MCLK, are enabled to pass through the cell to its output terminals GST and GTT.

GTSTEN must be connected to the GTSTEN terminal of the register latch of each test port controller cell 24. During normal operation GTSTEN will be at logic 0, forcing the module select output terminal (MSEL) of each test port controller cell 24 is controlled by the logic level at its SCAN input terminal or by the data stored in its latch.

The GTSTEN signal, when at a logic 1, must force the high-Z state of each output that is used as a input or test output. In addition, all bidirectional must be forced to the high-Z state (input mode) when GTSTEN is high, even if the bidirectional I/O pin is not used for a test signal. Each I/O used as a test input or output, when operating in the test mode, must be either an input, a bidirectional with a tristate output, or a tristate output. Note that open drain outputs and bidirectionals with open drain outputs are not allowed to be connected to test inputs or outputs. Open drain buffers do not contain a path by which a core signal can be connected to the output. The addition of such a path would also add a clamp diode to $V_{cc}$ which is undesirable in some applications.

In the event of a shortage of i/Os that can be used as test pins, a tristate output or a bidirectional with a tristate output can be configured so that the output functions like an open drain output. This is shown in FIG. 1 by connecting the buffer data input to the LO terminal of a tie-off cell 28 and controlling the enable terminal of the buffer 16 with the active signal. Additional logic 30 must be added to the active signal path to guarantee that the buffer is in the high-Z state when in the test mode.

Bidirectional or tristate buffers should not be configured to operate like open drain outputs if, in the intended application, the $V_{cc}$ of the ASIC design can be removed or ramped to 0 volts while the output is held at a logic 1 by another voltage source. As a result of this condition, current from the output to $V_{cc}$ through the clamp diode will cause the current density limits of the interconnect metalization to be exceeded. If, during use, the open drain outputs of the ASIC design are connected to a voltage source that is more positive than $V_{cc}$, the current density limits may be exceeded due to the current path through the clamp diode and the output voltage may be clamped below its peak level.

If the I/O to be used as a test input or output is required to be a tristate output during normal operation, then a logic gate is required to provide the correct function during both normal and test modes.

The shift register of the test port controller cell 24 used for module selection during operation in the test mode, is loaded by the test signals named SCAN-CNTRL, MAS-CLK, SLA-CLK, and SCAN-IN. The SCAN-CNTRL signal must be assigned to a package I/O pin that is connected to the input terminal of a non-inverting input buffer. The output of this buffer must be connected to the SCAN terminal of the test port clock controller cell 22, The same buffer output is connected to another cell or cells required to implement the signal path(s) controlled through the I/O pin during normal operation. When entering the test mode, SCAN-CNTRL must be driven to a logic 1 before a logic 1 is applied to TEST. This sequence guarantees that there will not be bus conflicts resulting from the unknown values within the shift register latches. When a logic 1 is applied to SCAN-CNTRL, the SCAN terminal of the test port controller cell 24 will be forced to a logic 1, producing a logic 1 at the GBUSEN (Global Bus Enable) output terminal of the test port clock controller cell 22. The GBUSEN output of the test port clock controller cell 22 must be connected to the GBUSEN input terminal of each of the shift register latch cells of the test port controller 24. When GBUSEN is at a logic 1, the MSEL output terminal of each test port controller 24 will be driven to a logic 0, ensuring that no module is selected when a logic 1 is applied to TEST (all test outputs of all modules are forced to the high-Z state).

The MAS-CLK, SLA-CLK and SCAN-IN signals must each be assigned to a package pin that is connected to the input terminal of a non-inverting input buffer. The outputs of the buffers associated with the signals MAS-CLK and SLA-CLK must be connected to the MCLK and SCLK input terminals of the test port clock controller cell 22, as shown in the design example.. The buffer outputs are also connected to other cells to implement the signal paths needed for normal operation of the design.

The output of the buffer associated with the SCAN-IN signal (buffer 14e) must be connected to the SCAN-IN input terminal of the first test port controller cell 24 and is wired to another cell or cells required to implement the signal path(s) used in normal operation. The SCANOUT output terminal of the first test port controller cell 24 is connected to the SCAN-IN input terminal of the second test port controller 24 to form the shift register. The SCANOUT output of the last test port controller 24 is left open.

The package I/O pins that are associated with MAS-CLK, SLA-CLK, and SCAN-IN can also be used to route test signals to modules. After the shift register consisting of the test port controller cells 24 has been loaded to select one of the modules, a logic 0 is applied to SCAN-CNTRL. The MAS-CLK, SLA-CK and SCAN-IN functions are then no longer needed until after the selected module has been tested and their assigned package pins can be used to route test signals to the selected module.

To select the 32×4 RAM for testing, waveforms of FIG. 2 may be used. The signals of FIG. 2 are exemplary of signals which would be used in actual operation.

Each module that is designed for parallel module testing has a separate test terminal corresponding to each terminal used during normal operation. The 32×4 RAM included in the design example has test terminals TI(0) through TI(3) that correspond to data input terminals D(0) through D(3). TI(0) and D(0) are multiplexed in the RAM module, with the GTSTEN signal selecting-the test mode or normal mode of operation.

In this example, D(0) through D(3) are driven by signals from the internal (core) logic 31 of the design. TI(0) through TI(3) are connected to the package signal pins SIGQ through SIGT as shown. The circuit should have adequate ESD and latchup protection circuitry to the I/O cells to allow this scheme to be used. When the normal mode of operation is selected, data may be entered the RAM through D(0) through D(3). When the test mode is entered (TEST=logic 1), data applied to TI(0) through TI(3) will be entered into the RAM.

The same scheme is used for address inputs A(0) through A(4), which are multiplexed with TI(4) through TI(8). The read/write input WZ is multiplexed with TI(9) and EZ is multiplexed with MSEL. The RAM output enable function, controlled by GZ is not needed in the test mede and has no corresponding test terminal.

RAM outputs Q(0)-Q(3) have corresponding test outputs TO(0)-TO(3). When in the test mode, Q(0)-Q(7) are forced to the high-Z state and, if the MSEL terminal is driven to a logic 1, valid data will be provided at terminals TO(0)-TO(3). When operating in the normal mode, TO(0)-TO(3) will be in the high-Z state.

Note that a single I/O pin can be used to drive one test terminal of each module in the design. This is allowed because, when operating in the test mode, only one module is active at any given time. It is recommended that test terminals of different modules with the same test terminal name be connected to the same I/O pin. For example, TI(0) of the 32×4 RAM and TI(0) of the 64×8 RAM are wired to the same I/O pin (SIGB) in the design example of FIGS. 1a–b.

When selecting a particular package for an ASIC containing a testable module, it is important to consider the number of test ports on the module because it will affect the total number of package pins required for a design.

Modules that are designed for PMT will have a test input multiplexed with each normal input and a test output paralleled with each normal output. These test inputs and test outputs will be connected to special ports on the input and output buffers so there will be an access point for testing modules. The special ports on the Input and output buffers are designed to bring the module test signals out to the package pins without adding any delay to the path of the functional signals.

The total number of package pins must be equal to or greater than the maximum number of test inputs on any module, plus the maximum number of test outputs on any module, plus a dedicated package test pin, plus an input assigned to be SCAN-CNTRL when in the test mode, plus the number $V_{cc}$ and ground pins.

Total number of pins = Max no. test inputs +
  Max no. test outputs + 1 Test pin + SCAN-CNTRL +
    $V_{cc}$ pins + Ground pins.

For example, FIGS. 1a–b depict a design example containing two modules, a 32×4 RAM. In this example, the 64×8 RAM has both the maximum number of test input and the maximum number of test outputs. The maximum number of test inputs and test outputs on a module designed for PMT will always be given in the module data sheet. The test inputs and test outputs are as follows:

8 test data inputs, TI0 through TI7 (pins 3–5, 12, 13, 6, 8 and 9)
6 test address inputs, TI8 through TI13 (pins 10, 11, and 14–17)
1 test read/write input, TI14 (pin 18)
8 test data outputs, TO0 through TO7 (pins 19, 20, 21 and 23–27)

Package pins 7 and 28 are grounds, pin 22 is $V_{cc}$, pin 1 is the dedicated test pin TEST and pin 2 is the normal input assigned to be SCAN-CNTRL when in the test mode. The minimum number of package pins required for this design is calculated as follows:

$TOTAL = 15$ Test inputs + 8 Test outputs + Test +

SIGA (SCAN-CNTRL) + 2 Grounds + $V_{cc} = 28$

Thus, a 28-pin package will work for this design.

Note that the test input and test output nets are connected directly to the package pin nets. When the design is laid out, the test nets will be connected no special ports on the input and output buffers. This will isolate the core logic from the I/O pins, avoid loading the input and output package pins, and avoid delay to the functional signals of the design.

Parallel Module Testing is described in greater detail in U.S. patent application Ser. No. 281,308 to Martin, filed Dec. 7, 1988, which is incorporated by reference herein.

Figure 3:
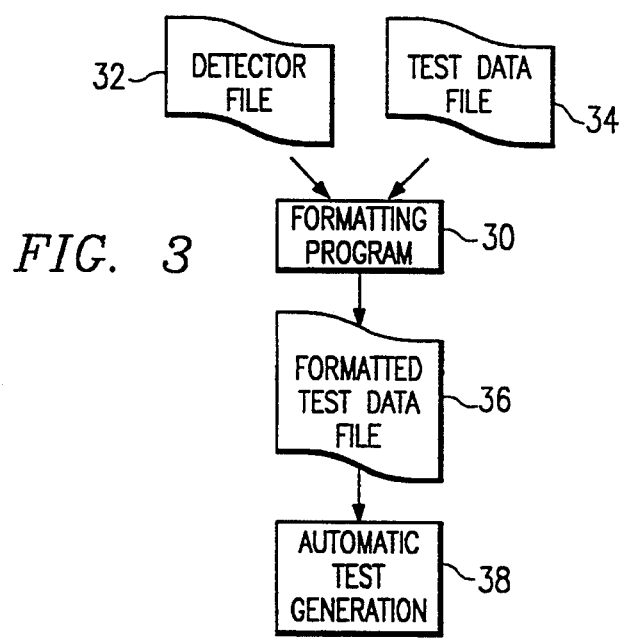
FIG. 3 illustrates a flow diagram for forming the formatted test data of the present invention.

FIG. 3 illustrates a flow chart describing the automatic test data formatter of the present invention. The formatting program 30 operates on two files: a detector file 32 and a test data file 34. The output of the formatting program 30 is a formatted test data file 36. The formatted test data file 36 is input to an automatic test generation program 38 which outputs the test data to the integrated circuit.

The format of the detector file 32 is illustrated in Appendix A. The detector file 32 is comprised of several subfiles. The first subfile is the I/O Interface Signal, Package Pin Match Subfile (hereinafter I/O Interface Subfile). This subfile contains one record for each of the pins used for testing. Each record has five fields: an HDL (customer) signal order field, an I/O signal name field, a package field, a pad cell type field and a test control use The HDL signal order indicates the order in which the signal names are arranged. The I/O signal name gives a name to each signal input to the integrated circuit. Each signal name corresponds to a package pin. The package pin field gives the package pin number for each I/O signal name. The pad cell type field describes the input or output buffer to which the pin is connected and the test control use field describes the use, if any, of the package pin has for initialization. Thus, for example, the HDL signal order 1 record describes an I/O signal having the name "AO_SCAN". This signal is input package pin 15 which is connected to an input buffer with the cell name "IPIO4LJ". This pin is used for inputting the SCAN signal during initialization.

In addition to the I/O interface subfile, a number of subfiles exist for each module in the integrated circuit which is to be tested. These subfiles are listed under the heading "TI/O Testability Nets by Unique Device Instance" in Appendix A. The records in this subfile have six fields: a device instance name field, a device cell name field, an I/O signal name field, a package pin field, a pin type name field, and a test pin type field.

The I/O signal name and package pin fields are the same as in the I/O interface subfile. The device instance name field indicates the designation of the device in the integrated circuits schematic. The device cell name indicates the cell library name for the module to be tested. The test pin type indicates the nature of the package pin; for example, a pin may be designated as a data in, address, read/write or data out pin. The pin type name indicates the name of the test node on the module to be tested.

The test data file 34 contains test data to be applied to the module under test. This data is typically ordered only by signal name and will not correspond to the desired order defined by the HDL signal order field.

Figure 4A:
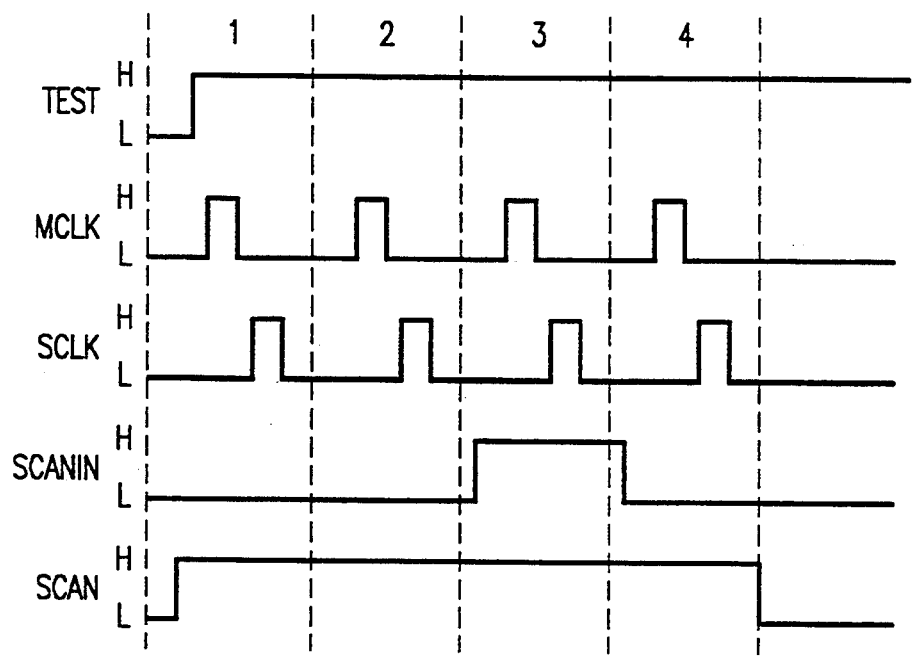
FIGS. 4a–b illustrate the PMT test control signals to be used to initialize the integrated circuit to test predetermined modules and the test patterns produced therefrom.
Figure 4B:
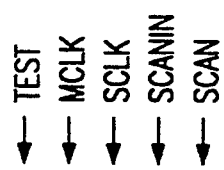

An example of data used to initialize the system is shown in FIGS. 4a–b. FIG. 4a illustrates the PMT test control signals used to initialize the integrated circuit to test a predetermined module. Each test pattern is preceded by the string "SETR P:=T'". The "L" and "H"

The formatting I program 30 inputs the detector indicate high and low values to be input to the IC. The "C" indicates a clock signal.

Figures 6A, 6B:
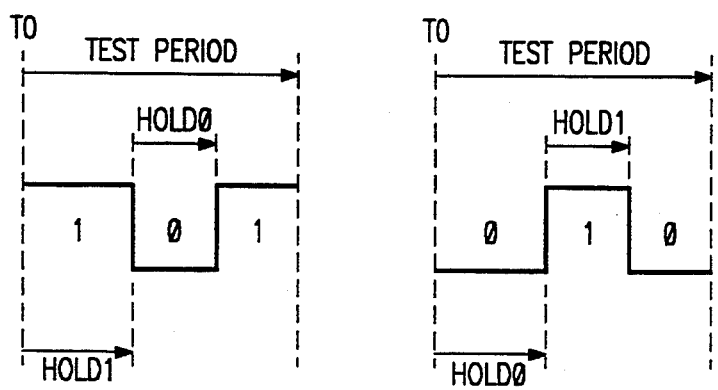
FIGS. 6a–b illustrate timing diagrams of positive and negative clock pulses as used in the present invention.

The formatting program 30 inputs the detector file 32 and the test data file 34 and outputs the formatted test data file 36. A formatted test data file is illustrated in FIG. 5. The formatted test data file 36 comprises header information which defines the relationship between various signals. The "CONNECT P,VAR=" section indicates the order of the signals defined in the detector file 32 by the HDL signal order field. Likewise, the "PIN=" section defines the order of package pin corresponding to the signals stated above. A "CLOCK" command defines a clock waveform that is to be applied during the execution of the pattern cell. The string following the command "CLOCK=" designates the signal which is to be defined by a subsequent "PATTERN=" command. The "PATTERN=" command defines the type of clock waveform to be applied ("010" indicating a positive clock pulse and "101" indicating a negative clock pulse), the "HOLDC=" command indicating the duration of the logic 0 portion of the clock pulse and the "HOLD1=" command indicating the duration of the logic 1 portion of the clock pulse. An example of positive and negative clock pulses is given in FIGS. 6a–b.

After the header information, the formatted test data file 36 sets forth the strings used to test the module. The first set of strings are used to set up the module for testing. As can be seen from comparing the strings in FIG. 4a to the strings used to test the CC648 cell shown in FIG. 5, a number of signals have been added to account for each package pin. Further, the arrangement of the signals has been modified as shown in the "VAR=" statement, in order to conform to a desired format.

In addition to the "H", "L" and "C" signals described hereinabove, the formatted test data file 36 includes other characters. A "Y" indicates that no signal is input to the associated package pin and an "M" indicates that the output from the associated package pin is masked. Further, a "Z" could be used to indicate that the expected output will be a high impedance (Z-state) at strobe time.

If more than one module is to be tested in the integrated circuit, the formatted test data will include additional header, initialization, and test data information as shown in FIG. 7.

The formatted test data file 36 is input to an automatic test generation program 38 which uses the information contained within the formatted test data file 36 to produce output signals to the integrated circuit and to compare the outputs of the integrated circuit with Eke actual output with expected test data.

The formatting program 30 maps the test data for each module to the correct package pins based on the test pin list contained in the detector file 32. The detector file 32 may be produced manually, or from a program which will automatically generate the detector file 32. The program 30 replaces the error prone manual task of formatting the data which is currently used for testing procedural cells. In addition to using the formatted test data file 36 with the automatic test data generation program 38, the formatted test data file 36 may be used during the design phase of a module to check a proposed design for errors using a computer aided design program.

Although the preferred embodiment of the invention has been described in detail, it should be understood that various changes, substitutions and alterations can be made therein without departing from the spirit and scope of the invention as defined by the appended claims.

---

APPENDIX A

DETECTOR OUTPUT FILE
Input HDL file name : SCRAMBLE
Design block name : CF11111

-continued

APPENDIX A

Technology Chosen : TSC500 1um Std Cell.
TDL_SCRAMBLE SUMMARY TABLES:
  A) I/O INTERFACE SIGNAL, PKG. PIN MATCH
  B) TI/O TESTABILITY NETS BY UNIQUE RAM INSTANCE
A)  I/O INTERFACE SIGNAL, PKG. PIN MATCH
    Number of interface signals: 26

| HDL SIGNAL ORDER | I/O SIGNAL NAME | PKG PIN | PAD CELL TYPE | TEST CONTROL USE |
|---|---|---|---|---|
| 1 | A0_SCAN | 15 | IPI04LJ | SCAN |
| 2 | A1_MCLK_TI0 | 16 | IPI04LJ | MCLK |
| 3 | A2_SCLK_TI1 | 17 | IPI04LJ | SCLK |
| 4 | A3_SCANIN_TI2 | 18 | IPI04LJ | SCANIN |
| 5 | A4_TI3 | 19 | IPI04LJ | |
| 6 | A5_TI4 | 20 | IPI04LJ | |
| 7 | CLK_TO6 | 3 | IPI04LJ | |
| 8 | D0_TI5 | 21 | IPI04LJ | |
| 9 | D1_TI6 | 22 | IPI04LJ | |
| 10 | D2_L0_TI7 | 23 | IPI04LJ | |
| 11 | D3_L1_TI8 | 24 | IPI04LJ | |
| 12 | D4_L2_TI9 | 25 | IPI04LJ | |
| 13 | D5_L3_TI10 | 26 | IPI10LJ | |
| 14 | D6_L4_TI11 | 27 | IPI04LJ | |
| 15 | D7_L5_TI12 | 1 | IPI04LJ | |
| 16 | LD_TO7 | 4 | IPI04LJ | |
| 17 | Q0_TI13 | 6 | OPI23LJ | |
| 18 | Q1_TI14 | 7 | OPI23LJ | |
| 19 | Q2_TO0 | 8 | OPI23LJ | |
| 20 | Q3_TO1 | 9 | OPI23LJ | |
| 21 | Q4_TO2 | 10 | OPI23LJ | |
| 22 | Q5_TO3 | 11 | OPI23LJ | |
| 23 | Q6_TO4 | 12 | OPI23LJ | |
| 24 | Q7_TO5 | 13 | OPI23LJ | |
| 25 | RD_WTZ | 5 | IPI04LJ | |
| 26 | TEST | 2 | IPIO4LJ | TEST |

B)  TI/O TESTABILITY NETS BY DEVICE
    Number of testable modules: 2

| DEVICE INSTANCE NAME | DEVICE CELL NAME | I/O SIGNAL NAME | PKG PIN | PIN TYPE NAME | TEST PIN TYPE |
|---|---|---|---|---|---|
| *U33 | CC646 | A1_MCLK_TI0 | 16 | TI0_XZ | DATA_IN |
| | | A2_SCLK_TI1 | 17 | TI1_XZ | DATA_IN |
| | | A3_SCANIN_TI2 | 18 | TI2_XZ | DATA_IN |
| | | A4_TI3 | 19 | TI3_XZ | DATA_IN |
| | | A5_TI4 | 20 | TI4_XZ | DATA_IN |
| | | D0_TI5 | 21 | TI5_XZ | DATA_IN |
| | | D1_TI6 | 22 | TI6_XZ | ADDR |
| | | D2_L0_TI7 | 23 | TI7_XZ | ADDR |
| | | D3_L1_TI8 | 24 | TI8_XZ | ADDR |
| | | D4_L2_TI9 | 25 | TI9_XZ | ADDR |
| | | D5_L3_TI10 | 26 | TI10_XZ | ADDR |
| | | D6_L4_TI11 | 27 | TI11_XZ | ADDR |
| | | D7_L5_TI12 | 1 | TI12_XZ | WR |
| | | Q2_TO0 | 8 | TO0_XZ | DATA_OUT |
| | | Q3_TO1 | 9 | TO1_XZ | DATA_OUT |
| | | Q4_TO2 | 10 | TO2_XZ | DATA_PUT |
| | | Q5_TO3 | 11 | TO3_XZ | DATA_OUT |
| | | Q6_TO4 | 12 | TO4_XZ | DATA_OUT |
| | | Q7_TO5 | 13 | TO5_XZ | DATA_OUT |
| *U34 | CC648 | A1_MCLK_TI0 | 16 | TI0_XZ | DATA_IN |
| | | A2_SCLK_TI1 | 17 | TI1_XZ | DATA_IN |
| | | A3_SCANIN_TI2 | 18 | TI2_XZ | DATA_IN |
| | | A4_TI3 | 19 | TI3_XZ | DATA_IN |
| | | A5_TI4 | 20 | TI4_XZ | DATA_IN |
| | | D0_TI5 | 21 | TI5_XZ | DATA_IN |
| | | D1_TI6 | 22 | TI6_XZ | DATA_IN |
| | | D2_L0_TI7 | 23 | TI7_XZ | DATA_IN |
| | | D3_L1_TI8 | 24 | TI8_XZ | ADDR |
| | | D4_L2_TI9 | 25 | TI9_XZ | ADDR |
| | | D5_L3_TI10 | 26 | TI10_XZ | ADDR |
| | | D6_L4_TI11 | 27 | TI11_XZ | ADDR |
| | | D7_L5_TI12 | 1 | TI12_XZ | ADDR |
| | | Q0_TI13 | 6 | TI13_XZ | ADDR |
| | | Q1_TI14 | 7 | TI14_XZ | WR |
| | | Q2_TO0 | 8 | TO0_XZ | DATA_OUT |
| | | Q3_TO1 | 9 | TO1_XZ | DATA_OUT |
| | | Q4_TO2 | 10 | TO2_XZ | DATA_OUT |
| | | Q5_TO3 | 11 | TO3_XZ | DATA_OUT |
| | | Q6_TO4 | 12 | TO4_XZ | DATA_OUT |

-continued

APPENDIX A

| Q7_TO5 | 13 | TO5_XZ | DATA_OUT |
| --- | --- | --- | --- |
| CLK_TO6 | 3 | TO6_XZ | DATA_OUT |
| LD_TO7 | 4 | TO7_XZ | DATA_OUT |

What is claimed is:

1. A method of producing formatted data for testing an integrated circuit having a module within it which is to be tested using parallel module testing, comprising the steps of:

generating test patterns to parallel test the module at the input and output boundary signals of the module;

providing a detector file for said module, said detector file indicating which package pins of said integrated circuit are to be used for testing said module, said detector file further describing boundary signals of said module as input and output signals and indicating which of the boundary signals are to be tested as inputs and which of the boundary signals of said module are to be tested as outputs, said detector file further specifying pins of the integrated circuit which are to be driven to certain values to control the integrated circuit while testing said module in a module test mode;

operating a formatting program on said test patterns and said detector file, said formatter program taking as inputs the information within the detector file and operable for using the information with the generated test patterns to create a formatted test data output file;

wherein said formatted test data output file contains said test patterns reordered for use at the package pins of the integrated circuit to test said module from the pins of said integrated circuit, the formatted test data output file also containing patterns to be applied to control pins of said integrated circuit to put the integrated circuit into the module test mode.

2. The method of claim 1 wherein said step of generating test patterns comprises the step of generating a table of logical values to be applied to said module input signals at predetermined clock intervals.

3. The method of claim 1 wherein said detector file further comprises the step of providing specific control data to be applied to control nodes in the integrated circuit while in said module test mode and arranging said control data in a predetermined order associated with input and output pins of said integrated circuit.

4. The method of claim 1 wherein said step of generating test patterns further comprises the step of generating expected output data from one or more of said output signals of said module.

5. The method of claim 4, wherein said step of creating a formatted test data file further comprises the step of arranging said expected predetermined order associated with said package pins, the predetermined order being provided in said detector file.

6. The method of claim 5 and further comprising the steps of applying said formatted test data file to the pins of the integrated circuit associated therewith and comparing said expected output data to the signals present on the output pins of the integrated circuit associated therewith.

7. The method of claim 1 wherein said step of generating test patterns further comprises the step of generating test patterns for a plurality of modules in said integrated circuit.

8. The method of claim 7 wherein said step of operating a formatting program comprises the step of operating said formatting program on said test patterns for each of said plurality of modules within said integrated circuit and creating a formatted test data file for each of said plurality of modules.

9. A method for producing formatted data for testing an integrated circuit by parallel module testing one or more modules within it, comprising the steps of:

providing a detector file for each of the modules within the integrated circuit, the detector file identifying the signals of the module which are to be tested as inputs, the signals of the module which are to be tested as outputs, the detector file further indicating which pins of the integrated circuit are to be used as inputs while testing the particular module and which pins of the integrated circuit are to be used as outputs while testing the particular module, the detector file further providing values to be applied to control pins of the integrated circuit while the particular module is being tested;

generating parallel test patterns for each of the modules within the integrated circuit, said parallel test patterns containing input data and expected output data;

operating a formatting pro,ram for each of the modules within the integrated circuit, the formatting program taking as inputs the generated parallel test patterns and the detector file, the formatting program using the information within said detector file to reorder the generated test patterns and creating a formatted test data file containing the parallel test patterns reordered for application at the package pins of said integrated circuit so that the particular module may be tested from the input and output pins of the integrated circuit; and repeating the last three steps for each of the modules within the integrated circuit so that a formatted test data file is created for each of the modules.

* * * * *